United States Patent
Kwak et al.

(10) Patent No.: US 7,166,906 B2
(45) Date of Patent: Jan. 23, 2007

(54) PACKAGE WITH BARRIER WALL AND METHOD FOR MANUFACTURING THE SAME

(75) Inventors: Min-Keun Kwak, Cheonan-si (KR); Il-Ki Kim, Namyangju-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 51 days.

(21) Appl. No.: 10/850,110

(22) Filed: May 21, 2004

(65) Prior Publication Data

US 2005/0260844 A1 Nov. 24, 2005

(51) Int. Cl.
*H01L 23/02* (2006.01)

(52) U.S. Cl. .................. 257/678; 257/779; 257/787; 257/774; 257/E21; 257/499; 257/519

(58) Field of Classification Search ............. 257/678, 257/196, 643, 686, 689, 697, 738, 777, 778, 257/779, 780, 781, 782, 783, 784, 786, 787, 257/774

See application file for complete search history.

(56) References Cited

U.S. PATENT DOCUMENTS

| | | | |
|---|---|---|---|
| 6,429,508 B1 * | 8/2002 | Gang | 257/678 |
| 6,498,388 B1 * | 12/2002 | Kim et al. | 257/666 |
| 6,566,168 B1 * | 5/2003 | Gang | 438/112 |
| 2004/0262746 A1 * | 12/2004 | Jung | 257/713 |

* cited by examiner

*Primary Examiner*—David Nhu
(74) *Attorney, Agent, or Firm*—Harness, Dickey & Pierce, P.L.C.

(57) ABSTRACT

A ball grid array (BGA) package that may suppress flash contamination may include a flash contamination barrier wall. The barrier wall may be a portion of a copper pattern provided on a substrate. During a molding process, the flash contamination barrier may prevent a flash from contaminating a ball land. The barrier wall may restrict the flash to flow through a concave portion that may be defined by a surface of the substrate.

13 Claims, 5 Drawing Sheets

PACKAGE WITH BARRIER WALL AND METHOD FOR MANUFACTURING THE SAME

BACKGROUND OF THE INVENTION

1. Field of the Invention

The present invention generally relates to a semiconductor package and a method of manufacturing the same. More particularly, the present invention relates to a package that may reduce flash contamination and a method of manufacturing the same.

2. Description of the Related Art

Semiconductor packages may be used to house semiconductor chips. It is generally desirable for such packages to be scaled down in size due to a reduction in the size of electronic devices. To this end, conventional semiconductor packages that employ leads as external connection terminals, such as (for example) a small outline package (SOP), a plastic leaded chip carrier (PLCC), a plastic quad flat package (PQFP) and a pin grid array (PGA), may have been superseded by new semiconductor packages that employ solder balls or solder bumps as external connection terminals, such as (for example) a ball grid array (BGA) and a chip scale package (CSP). External connection terminals in the form of leads may be replaced by external connection terminals in the form of solder balls because the use of solder balls may provide for decreases in the sizes of semiconductor packages.

For semiconductor packages using solder balls as external connection terminals, solder joint reliability (SJR) is a consideration.

FIG. 1 is a cross-sectional view of a conventional wire-bonding BGA package.

Referring to FIG. 1, wire bonding may be performed near the center of a BGA substrate 10. An epoxy mold compound (EMC) may be applied via a molding process onto a bond wire 70 and a portion of a semiconductor chip 30 exposed via the substrate 10. The resultant structure may be referred to as a wire bonding BGA (WBBGA) package 90.

In the WBBGA package 90, the substrate 10 may include a substrate body 12, a copper pattern 14 and a solder resist 16. The substrate body 12 may be formed of an insulating material, such as a glass fiber epoxy laminate (e.g., FR4). The copper pattern 14 may be formed on the substrate body 12 and may include a ball land. The solder resist 16 may be coated on the copper pattern 14 to protect the copper pattern 14 from a short. A solder ball 20, which serves as an external connection terminal, may be attached to a surface of the substrate 10. A first EMC portion 50B may be molded to encapsulate the bond wire 70. The first EMC portion 50B may be located at the center of the substrate 10. A semiconductor chip 30 may be mounted on a surface of the substrate 10 opposed to the surface on which the solder ball 20 is attached. The semiconductor chip 30 may be mounted on the substrate 10 using an adhesive 40. A second EMC portion 50A may be molded to encapsulate the semiconductor chip 30 and the adhesive 40.

However, when the WBBGA package 90 is manufactured, flash contamination may occur during a molding process for forming the first EMC portion 50B. Such flash contamination may weaken the adhesion strength of the solder ball 20 to the WBBGA package 90.

FIG. 2 is a partial magnified plan view of the WBBGA package 90 depicted in FIG. 1 when the flash contamination occurs. In FIG. 2, the solder balls 20 are not depicted for clarity.

Referring to FIG. 2, a flash 60 may be generated when the first EMC portion 50B is formed via a molding process. The term flash refers to remnants of the EMC that may flow away from the first EMC portion 50B (and onto unintended portions of the substrate 10) during the formation of the first EMC portion 50B. Generally, the EMC should be formed without generating flash defects. However, flash defects may be inevitable due to the flatness of the substrate 10 (see FIG. 1), the performance of a molding apparatus, and the like. When flash 60 is generated, the EMC may flow in an unobstructed fashion over the solder resist 16 on the substrate body 12 and may contaminate a ball land 14A of the copper pattern 14. The contamination caused by the flash 60 may weaken the adhesion strength of the solder ball 20 (see FIG. 1) to the ball land 14A during a process of attaching the solder ball 20 to the ball land 14A, thus lowering the SJR.

FIG. 3 is a cross-sectional view taken along line III–III' of FIG. 2, and FIG. 4 is a cross-sectional view of a portion IV of FIG. 2 in which flash contamination has occurred.

Referring to FIGS. 3 and 4, in a substrate for a BGA package, a copper pattern including the ball land 14A may be formed on a substrate body 12, and a solder resist 16 may be formed on the copper pattern. Thus, a portion of the substrate where the solder resist 16 is formed may have a high height, as compared to the heights other portions of the substrate where the solder resist 16 is not formed, e.g. the ball lands 14A. Hence, if a flash is generated, the flash may naturally flow from the solder resist 16 along the substrate body 12 an onto the ball land 14A.

SUMMARY OF THE INVENTION

Exemplary embodiments of the present invention may provide a BGA package (for example), in which a flash contamination barrier wall may be formed by changing a pattern design that may include a ball land. The barrier wall may suppress flash contamination and may improve solder joint reliability (SJR).

Exemplary embodiments of the present invention may provide a method of manufacturing the package.

On exemplary, non-limiting embodiment of the present invention may provide a BGA package for suppressing flash contamination. The BGA package may comprise a substrate that may have a substrate body formed of an insulating material, a copper pattern formed on the substrate body and having a ball land, and a solder resist covering a portion of the copper pattern. The substrate may have an opening (e.g., a slit). The opening may be provided in the center of the substrate A flash contamination barrier wall may be provided on the substrate body and may be covered by the solder resist. The flash contamination barrier wall may constitute a portion of the copper pattern of the substrate A semiconductor chip may be adhered to the substrate such that an active region of the semiconductor chip may face the substrate. The semiconductor chip may include a bond pad that may be disposed near the center of the semiconductor chip. A bond wire may electrically connect the bond pad, which may be exposed through the substrate opening, to the copper pattern of the substrate. An EMC may be molded to provide a first EMC portion that may encapsulate the semiconductor chip and the bond wire, which may be exposed through the substrate opening. A solder ball may be adhered to the ball land, which may be exposed through the solder resist of the substrate.

The flash contamination barrier wall may be formed at the ball land adjacent to the first EMC portion. The flash contamination barrier wall may have a shape that surrounds the ball land.

Another illustrative, non-limiting embodiment of the present invention may provide a method of manufacturing a BGA package that may suppress flash contamination. The method may involve preparing a substrate having a flash contamination barrier wall. The substrate may also have an opening (e.g., a slit), which may be located at the center of the substrate. A semiconductor chip may be adhered to the substrate using an adhesive. The semiconductor chip may have a bond pad. The bond pad of the semiconductor chip may be connected to a copper pattern on the substrate through the opening of the substrate using a bond wire An EMC may be molded to provide a first EMC portion and a second EMC portion on the substrate. A solder ball may be adhered to the substrate. A singulation process may be performed to separate the substrate into respective BGA packages. Flash contamination of a ball land of the substrate may be prevented using the flash contamination barrier wall of the substrate during the molding of the EMC.

Another illustrative, non-limiting embodiment of the present invention may provide a method of manufacturing a BGA package that may suppress flash contamination. The method may involve preparing a substrate for a BGA package that may have a flash contamination barrier wall. The substrate may have an opening (e.g., a slit) that may be disposed in the center of the substrate. A semiconductor chip may be provided on the substrate using an adhesive. A bond pad may be disposed in the center of the semiconductor chip. The bond pad of the semiconductor chip may be connected to a copper pattern on the substrate through the substrate opening by a bond wire. An EMC may be molded to provide a first EMC portion on a first surface of the substrate that may be connected to the bond wire. An EMC may be molded to provide a second EMC portion that may surround the semiconductor chip and the adhesive, which may be disposed on a second surface of the substrate that may be opposite to the first surface of the substrate. A solder ball may be adhered to the substrate. A singulation process may be performed to separate the substrate into respective BGA packages. Flash contamination of a ball land of the substrate may be prevented using the flash contamination barrier wall of the substrate during the molding of the substrate.

A BGA package of the present invention may further include a flash contamination barrier wall that may prevent a flash from contaminating ball lands of a substrate. Thus, when flash may be generated, a flow of the flash may be changed using a concave portion and/or a convex portion that may be formed by the flash contamination barrier wall.

The flash contamination barrier wall, which may be formed on a substrate for a BGA package, may prevent the flash from flowing into the ball lands during a molding process. In this way, the SJR may be improved.

BRIEF DESCRIPTION OF THE DRAWINGS

Various features of the present invention will become readily apparent from the description of the exemplary embodiments that follows, with reference to the attached drawings in which.

DETAILED DESCRIPTION OF THE INVENTION

Exemplary embodiments of the present invention will now be described more fully with reference to the accompanying drawings. This invention may, however, be embodied in many different forms and should not be construed as being limited to the exemplary embodiments set forth herein. Rather, these embodiments are provided so that this disclosure will be thorough and complete, and will fully convey the concept of the invention to those skilled in the art.

Figure 1:
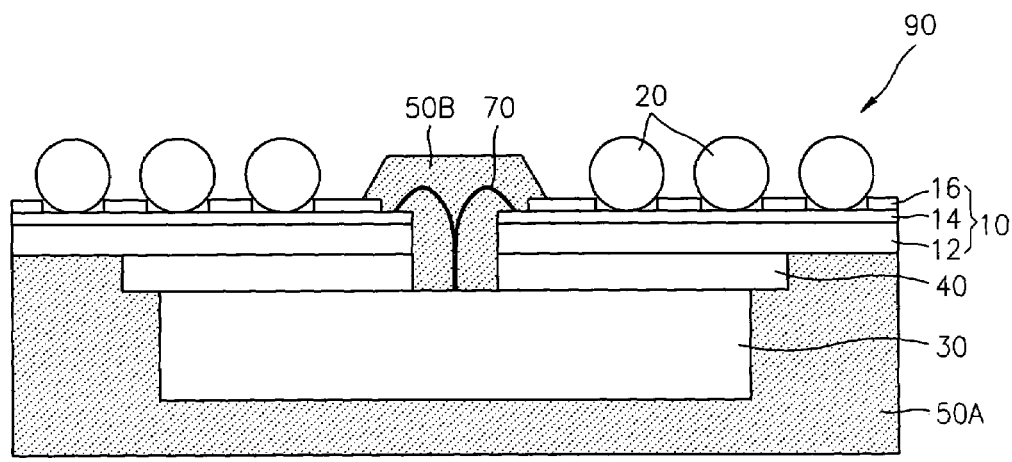
FIG. 1 is a cross-sectional view of a conventional wire-bonding BGA package.
Figure 2:
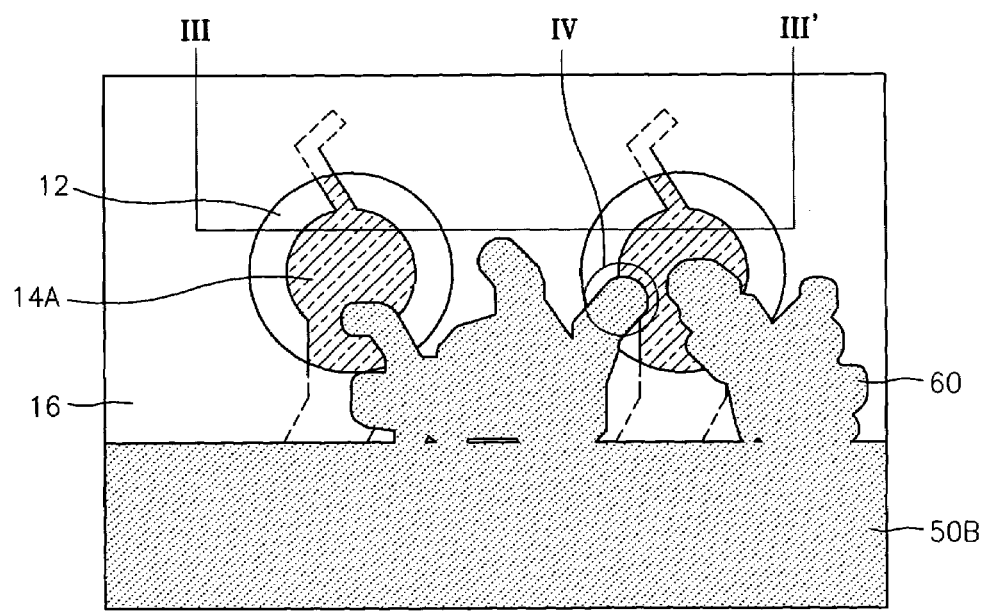
FIG. 2 is a partial, magnified plan view of the conventional wire-bonding BGA package depicted in FIG. 1, in which flash contamination has occurred.
Figure 3:
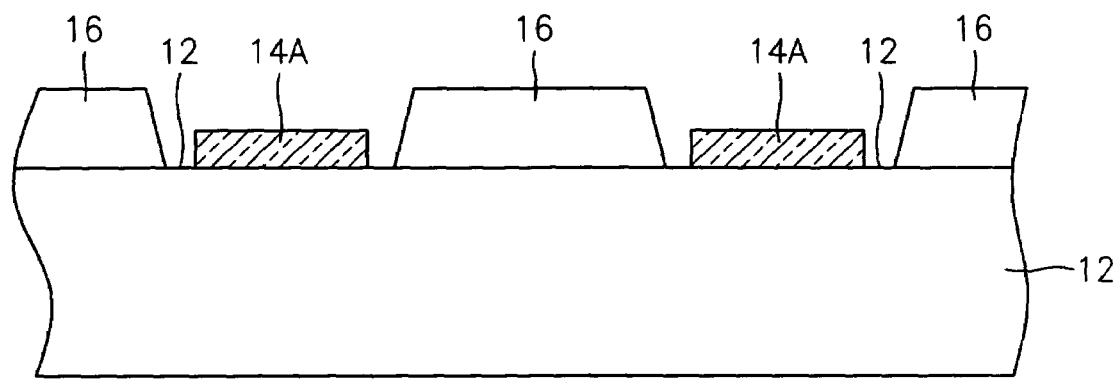
FIG. 3 is a cross-sectional view taken along line III–III' of FIG. 2.
Figure 4:
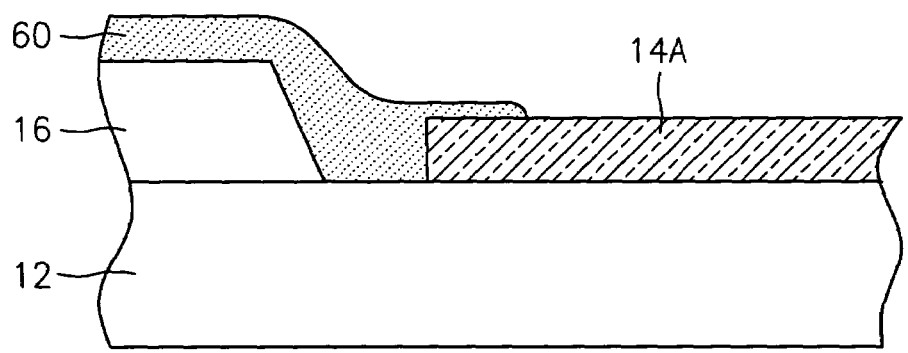
FIG. 4 is a cross-sectional view of a portion IV of FIG. 2.
Figure 5:
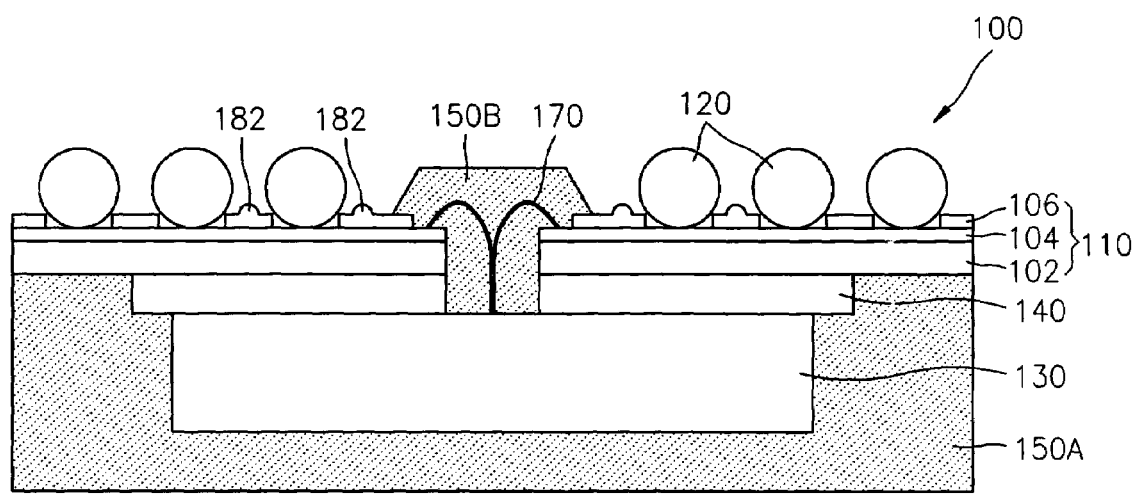
FIG. 5 is a cross-sectional view of a wire-bonding BGA package according to an exemplary embodiment of the present invention.

Referring to FIG. 5, an exemplary, non-limiting embodiment of a BGA package 100 that suppresses flash contamination may include the following elements: a substrate 110, which may include a substrate body 102, a copper pattern 104, and a solder resist 106; a flash contamination barrier wall 180 (see FIG. 6); a semiconductor chip 130; a bond wire 170; a first EMC portion 150B; and a solder ball 120.

Although the illustrated substrate 110 includes three distinct layers (the substrate body 102, the copper pattern 104, and the solder resist 106), those skilled in the art will appreciate that the invention is not so limited. For, example, the substrate 110 may include additional layers (not shown), as is well known in this art. The substrate 110 may have an opening, and in the illustrated exemplary embodiment, the opening may be in the form of a slit that is located in the center of the substrate 110. But the invention is not so limited. For example, the opening may have a variety of shapes (as opposed to a slit), and further may be positioned in a variety of locations (as opposed to the center of the substrate 110). The substrate body 102 may be formed of an insulating material. The copper pattern 104 may be located above the substrate body 102 and may include a ball land 104A (see FIG. 6). Those skilled in the art will appreciate that the pattern 104 may be fabricated from other conductive materials (besides copper), as is well known in this art. The solder resist 106 may cover a portion of the copper pattern 104.

In the exemplary embodiment, the flash contamination barrier wall 180 may be formed on a surface of the substrate body 102. The barrier wall 180 may constitute a portion of the copper pattern 104. And the barrier wall 180 may be covered by the solder resist 106.

The semiconductor chip 130 may be adhered to a surface of the substrate 110 by an adhesive 140, such that an active region of the semiconductor chip 130 may face the substrate 110. The bond wire 170 may electrically connect a bond pad (not shown) of the semiconductor chip 130, which may be partially exposed through the slit of the substrate 110, to the copper pattern 104 of the substrate 110. Two bond wires 170 are illustrated in FIG. 5, however those skilled in the art will readily appreciate that the invention is not limited to any particular number of bond wires.

The first EMC portion 150B may be formed (via a molding process) on the portion of the semiconductor chip 130 that is exposed via the slit of the substrate 110 and the bond wire 170. The molding process (which is well known in this art) may be carried out in such a manner so that the EMC material (which is well known in this art) may encapsulate the exposed portion of the semiconductor chip 130 and the bond wire 170. The solder ball 120 may be attached to the ball land 104A exposed through a top surface of the substrate 110.

The substrate body 102 may be fabricated from a rigid-type material such as FR4 or a flexible material such as polyimide. The substrate body 102 may be fabricated from a variety of other suitable materials, as is well known in this art. The solder resist 106 may cover a portion of the copper pattern 104 and may expose other portions of the copper pattern 104. For example, in the exemplary embodiment, the solder resist 106 may not cover the portion of the copper pattern 104 that is connected to the bond wire 170 and the portion of the copper pattern 104 (i.e., the ball land 104A) that is connected to the solder ball 120. The solder resist 106 may be an insulating layer that covers the copper pattern 104 and may protect the copper pattern 104 from a short caused by foreign conductive materials.

The semiconductor chip 130 may be a memory device such as a DRAM. However, the invention is not limited in this regard, and those skilled in the art will readily appreciate that the semiconductor chip 130 may be employed to implement a variety of devices, as is well known in this art. In the exemplary embodiment, the bond pads of the semiconductor chip, which may be connected to the bond wire 170, may be disposed in rows along a side (i.e., the upward facing side in FIG. 5) of the semiconductor chip 130. The number of bond pad rows is not a limitation of the invention; i.e., it will be readily apparent to those skilled in the art that bond pads of the semiconductor chip 130 may be arranged in a single row or a plurality of rows. Further, the bond pad rows may be centered on the side of the semiconductor chip 130. Those skilled in the art, however, will appreciate that the bond pad rows may be positioned at a variety of alternative locations (as opposed to being centered). The semiconductor chip 130 may be adhered to the substrate 110 by an adhesive 140 such as an adhesive tape (for example). The invention is not so limited, and it will be appreciated that semiconductor chip 130 and the substrate 110 may be assembled together via other conventional techniques, as is well known in the art. The semiconductor chip 130 may include an active region where a circuit region is formed. The active region of the semiconductor chip may face the substrate 110.

The first EMC portion 150B may be provided (via a molding process) on selected portions of the substrate 110. For example, the first EMC portion 150B may cover and encapsulate the portion of the copper pattern 104 that is connected to the bond wire 170. The first EMC portion 150B may not cover and encapsulate the ball land 104A, to which the solder ball 120 may be attached. An exemplary, non-limiting embodiment of the flash contamination barrier wall 180 will be described in detail with reference to FIG. 6.

Figure 6:
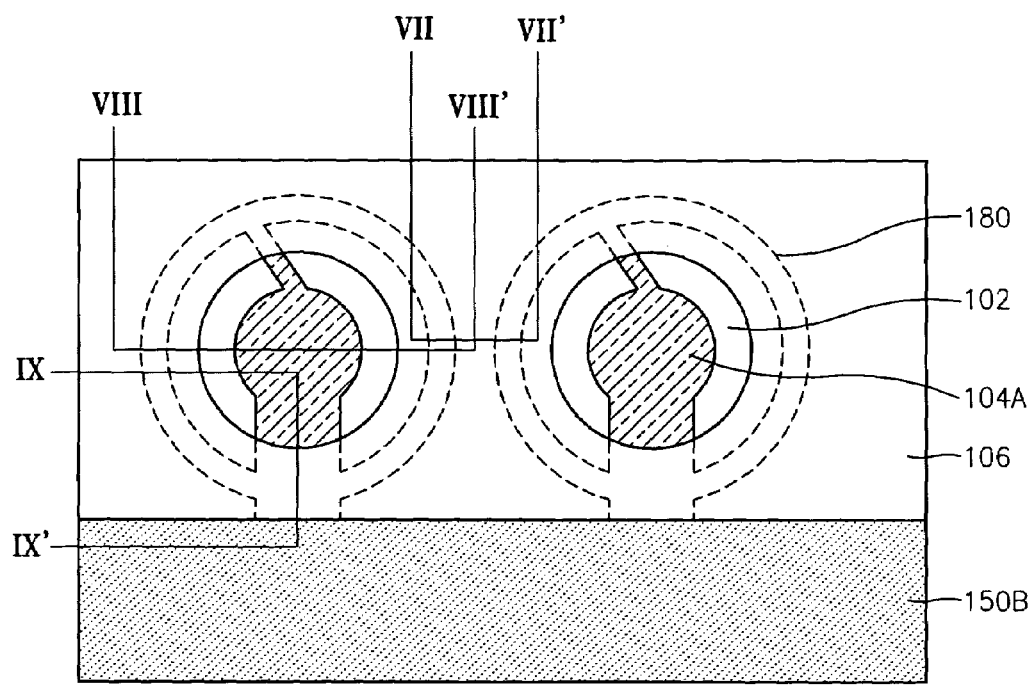
FIG. 6 is a partial, magnified plan view of the wire-bonding BGA package depicted in FIG. 5.

FIG. 6 is a partial, magnified plan view of the BGA package 100 depicted in FIG. 5, in which a flash contamination barrier wall 180 may be formed. In FIG. 6, the solder balls 120 are not depicted for clarity.

Referring to FIG. 6, the exemplary flash contamination barrier wall 180 may be provided for each ball land 104A of the substrate 110. However, flash contamination may be more likely to occur on those ball lands 104A that are relatively close to the first EMC portion 150B, as compared to those ball lands 104A that are relatively far from the first EMC portion 150B. Thus, a barrier wall 180 may not be provided for each of the outermost ball lands 104A. It will be appreciated that the invention is not limited to a particular number of barrier Walls 180: a barrier wall 180 may be provided for any of the ball lands 104A of the substrate.

In this exemplary, non-limiting embodiment, the flash contamination barrier wall 180 may have a ring shape that extends all the way around the perimeter of the ball land 104A. The barrier wall 180 may have the same height as the ball land 104A. The barrier wall 180 may be formed in the same process as the copper pattern 104. The barrier wall 180 may have a smaller width than the ball land 104A. The details of this embodiment are presented as an example only, and are not limitations of the invention.

It will be appreciated that numerous and varied details of construction and fabrication of the barrier wall 180 may be employed without departing from the scope of the invention. For example, the flash contamination barrier wall 180 may not perform electrical functions, and therefore it may not be electrically connected to the ball land 104A. As shown in FIG. 6, however, the barrier wall 180 may be electrically connected to the ball land 104A. Also, the shape of the flash contamination barrier wall 180 may be varied. For example, the barrier wall may have a square shape, a triangle shape, an oval shape, a diamond shape, etc., that extends around the perimeter of the ball land 104A. The barrier wall may also have a shape that does not extend all the way around the ball land 104A, e.g., a V-shape, a U-shape, an L-shape, etc. It will be appreciated that the shape of the barrier wall may be symmetrical or asymmetrical. The barrier walls on a particular substrate 110 may have different shapes or the same shape. A single barrier wall may be provided for more than one ball land 104A, i.e., a one-to-one correspondence between the barrier walls and ball lands 104A need not exist. The barrier wall may be of a height that is greater than that of the ball land 104A. The barrier wall and the copper pattern may be concurrently formed in a process, or sequentially formed in separate processes.

The flash contamination barrier wall 180 may be covered by the solder resist 106, and this may cause the substrate 110 to have an uneven surface. The flash contamination barrier wall 180 (and the substrate's uneven surface) may prevent flash contamination by confining and directing a flash flow. An exemplary effect of the flash contamination barrier wall 180 Will be described hereinafter with reference to FIGS. 7 through 9.

Figure 7:
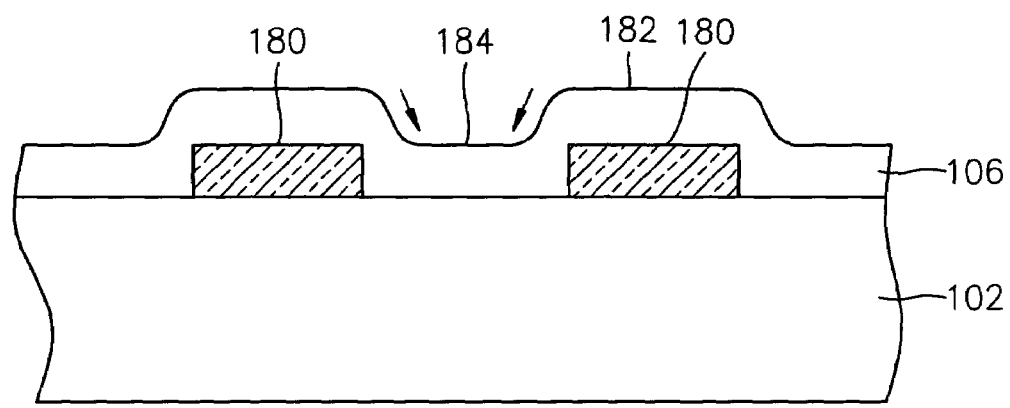
FIG. 7 is a cross-sectional view taken along line VII–VII' of FIG. 6.
Figure 8:
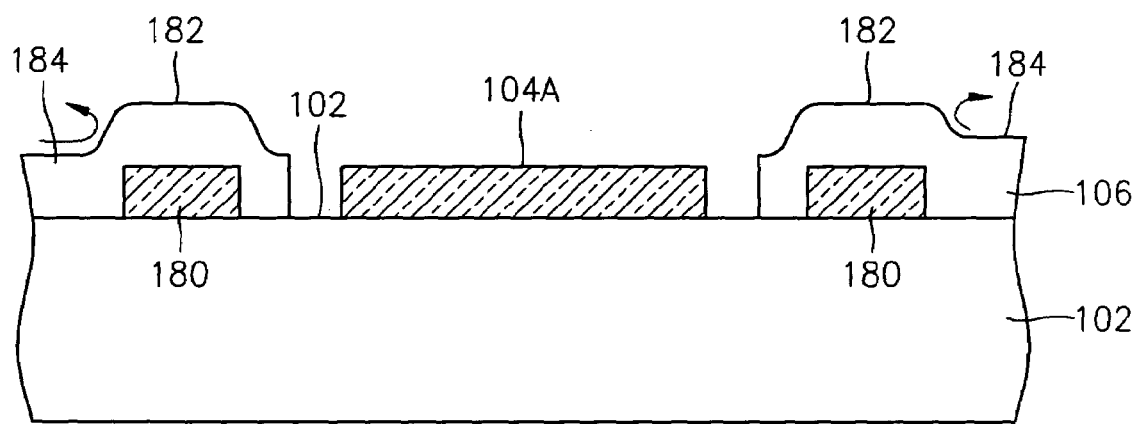
FIG. 8 is a cross-sectional view taken along line VIII–VII' of FIG. 6.
Figure 9:
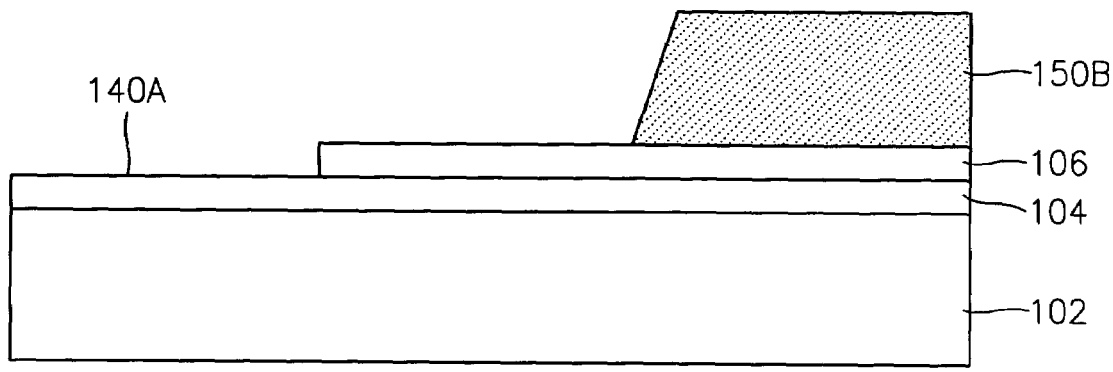
FIG. 9 is a cross-sectional view taken along line IX–IX' of FIG. 6.

FIG. 7 is a cross-sectional view taken along line VII–VII' of FIG. 6, FIG. 8 is a cross-sectional view taken along line VIII–VIII' of FIG. 6, and FIG. 9 is a cross-sectional view taken along line IX–IX' of FIG. 6.

Referring to FIGS. 7 through 9, the flash contamination barrier wall 180 may cause the solder resist 106 to have a convex (or raised) portion 182 and a concave (or recessed) portion 184, as shown in FIG. 7. When the flash is generated, the convex portion 182 may serve as a barrier that prevents the flash from flowing onto the ball land 104A as indicated by the arrows shown in FIGS. 7 and 8. The concave portion 184 may serve as a path through which the flash flows. In other words, any flash flowing toward the ball land 104A may be redirected by the convex portion 182 away from the ball land 104A and through the concave portions 184.

Thus, even though a flash may be generated during a molding process, the concave portion 184 and the convex portion 182, which may be formed as a result of the flash contamination barrier wall 180, may protect the ball land 104A from the flash contamination.

Figure 10:
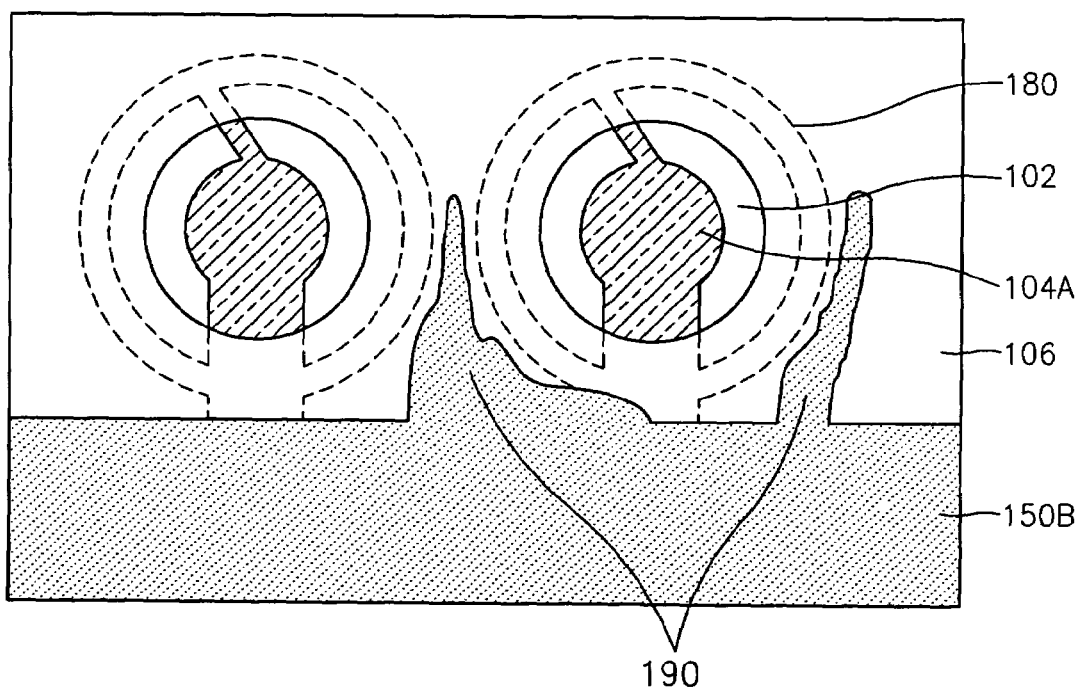
FIG. 10 is a plan view illustrating how the flash contamination barrier wall of FIG. 6 may prevent flash contamination.

FIG. 10 is a plan view illustrating how the flash contamination barrier wall of FIG. 6 may prevent flash contamination by, for example, redirecting and confining the flash flow.

Referring to FIG. 10, when a flash 190 is generated during a molding process, the flash 190 may flow around (but may not flow over) the convex portion 182 that may be formed as a result of a flash contamination barrier wall 180. The convex portion 182 may direct the flash to flow through the concave portion 184. In this way, a ball land 104A may be protected from flash contamination. Without flash contamination, a solder ball may be reliably adhered to the ball land 104A, thus enhancing the SJR of the WBBGA package 100 in FIG. 5.

An exemplary, non-limiting embodiment of a method of manufacturing the BGA package that may suppress flash contamination will be described with reference to FIGS. 5 and 6.

A substrate 110 for a BGA package may be prepared. A flash contamination barrier wall 180 in FIG. 6 may be formed on a top surface of the substrate body 102, and a slit may be formed in the center of the substrate 110. A semiconductor chip 130, on which a bond pad may be formed, may be adhered to a surface of the substrate 110 using an adhesive 140 (for example) in a die attach process. Thereafter, a wire bonding process may be performed. Thus, the bond pad of the semiconductor chip 130 may be connected to a copper pattern 104 of the substrate 110 by a bond wire 170 through the slit formed in the substrate 110. Then, a first EMC portion 150B and a second EMC portion 150A may be formed via a molding process. During the molding process, flash contamination of the ball land 140A of the substrate 110 may be prevented by virtue of the flash contamination barrier wall 180. A solder ball 120 may be attached to the top surface of the substrate 110. A singulation process may be performed, thereby separating the substrate 110 into respective BGA packages.

In the above-described method, the flow of the flash may be controlled and directed by the convex portion 182 and the concave portion 184, which may result from the flash contamination barrier wall 180, allowing the flash to only flow through the concave portion 184. Although, the first EMC portion 150B and the second EMC portion 150A were molded concurrently, the invention is not so limited and the first and the second EMC portions 150A, 150B may be molded sequentially as described below.

In another exemplary, non-limiting embodiment of a manufacture method, a substrate 110 for a BGA package may be prepared. A flash contamination barrier wall 180 in FIG. 6 may be formed on a top surface of the substrate 110, and a slit may be formed in the center of the substrate 110. A semiconductor chip 130, on which a bond pad may be formed in the center, may be adhered to a surface of the substrate 110 using an adhesive 140 (for example) in a die attach process. Thereafter, a wire bonding process may be performed. Thus, the bond pad of the semiconductor chip 130 may be connected to the copper pattern 104 of the substrate 110 by a bond wire 170 through the slit formed in the substrate 110. The first EMC portion 150B may be formed in a molding process. During the molding process, flash contamination of the ball land 180 of the substrate 110 may be prevented because of the flash contamination barrier wall 180. The second EMC portion 150A may be formed in another molding process. A solder ball 120 may be attached to the top surface of the substrate 110. A singulation process may be performed separating the substrate 110 into respective BGA packages.

As described above, a flash contamination barrier wall may be formed on a substrate of a BGA package to prevent a flash from flowing onto a ball land area during a molding process. As a result, the SJR of the BGA package may be enhanced.

Although the exemplary embodiments above have been implemented as WBBGA packages, the present invention is not so limited. For example, embodiments of the invention may be implemented as other packages (e.g., BGA packages) that may experience flash contamination and the associated shortcomings. In addition, a BGA package of the present invention may further comprise a heat sink for emitting heat generated by a semiconductor chip.

While the present invention has been particularly shown and described with reference to exemplary embodiments thereof, it will be understood by those of ordinary skill in the art that numerous and varied changes in form and details may be implemented without departing from the spirit and scope of the present invention as defined by the following claims.

What is claimed is:

1. A package comprising:
   a substrate including a substrate body formed of an insulating material, a pattern provided on the substrate body and having a ball land, and a solder resist covering a portion of the pattern, the substrate provided with an opening;
   a flash contamination barrier wall provided on the substrate body and covered by the solder resist;
   a semiconductor chip provided on the substrate, the semiconductor chip including a bond pad;
   a bond wire extending through the opening of the substrate, the bond wire electrically connecting together the bond pad of the semiconductor chip and the pattern of the substrate;
   a first EMC portion encapsulating the bond wire and a portion of the semiconductor chip confronting the opening of the substrate; and
   a solder ball provided on the ball land.

2. The package of claim 1, wherein the substrate body is formed of a rigid material.

3. The package of claim 1, wherein the substrate body is formed of a flexible material.

4. The package of claim 1, wherein the ball land and a portion of the pattern, which is connected to the bond wire, are not covered by the solder resist.

5. The package of claim 1, wherein the flash contamination barrier wall is disposed at the ball land adjacent to the first EMC portion.

6. The package of claim 5, wherein the flash contamination barrier wall has a ring shape that surrounds the ball land.

7. The package of claim 5, wherein the flash contamination barrier wall has the same height as the ball land.

8. The package of claim 5, wherein the flash contamination barrier has a smaller width than the ball land.

9. The package of claim 5, wherein the semiconductor chip is adhered to the substrate via an adhesive tape.

10. The package of claim 1, further comprising a second EMC portion encapsulating the semiconductor chip and an adhesive interposed between the semiconductor chip and the substrate.

11. A package comprising:
a substrate having
an electrically conductive pattern with a ball land, and
a solder resist provided on the electrically conductive pattern so that the ball land is exposed through the solder resist;
a bond wire electrically connected to the electrically conductive pattern; and
a first EMC portion encapsulating the bond wire,
wherein the solder resist has an outer surface defining a concave portion and a convex portion that is interposed between the first EMC portion and the ball land.

12. The package according to claim 11, wherein the concave portion and the convex portion extends completely around a perimeter of the ball land.

13. The package according to claim 11, wherein the concave portion and the convex portion is superimposed over the electrically conductive pattern.

* * * * *